US012004303B2

(12) United States Patent
Van De Vijver et al.

(10) Patent No.: US 12,004,303 B2
(45) Date of Patent: Jun. 4, 2024

(54) SYSTEMS FOR COATING A SUBSTRATE (71) Applicant: NORDSON CORPORATION, Westlake, OH (US)

(72) Inventors: Michel Van De Vijver, Kortenbert (BE); Stephane Etienne, Bouaye (FR); Ronny Franken, Dilsen-Stokkem (BE); Marc Knippenberg, Bree (BE)

(73) Assignee: Nordson Corporation, Westlake, OH (US)

( * ) Notice: Subject to any disclaimer, the term of this patent is extended or adjusted under 35 U.S.C. 154(b) by 878 days.

(21) Appl. No.: 16/761,850

(22) PCT Filed: Nov. 9, 2018

(86) PCT No.: PCT/US2018/059995
§ 371 (c)(1),
(2) Date: May 6, 2020

(87) PCT Pub. No.: WO2019/094699
PCT Pub. Date: May 16, 2019

(65) Prior Publication Data
US 2021/0195754 A1    Jun. 24, 2021

Related U.S. Application Data

(60) Provisional application No. 62/584,259, filed on Nov. 10, 2017.

(51) Int. Cl.
*H05K 3/22*   (2006.01)
*B05D 3/02*   (2006.01)
(Continued)

(52) U.S. Cl.
CPC ......... *H05K 3/0091* (2013.01); *B05D 3/0272* (2013.01); *H05K 3/227* (2013.01);
(Continued)

(58) Field of Classification Search
CPC ...... B05D 3/108; B05D 7/546; B05D 3/0272; H05K 3/227; H05K 3/28;
(Continued)

(56) References Cited

U.S. PATENT DOCUMENTS 4,300,184 A   11/1981  Colla
4,872,270 A   10/1989  Fronheiser et al.
(Continued)

FOREIGN PATENT DOCUMENTS

EP    0703423 A1    3/1996
JP    02-061479 U   5/1990
(Continued)

OTHER PUBLICATIONS

Rissanen et al., "Vapor-phase self-assembled monolayers for improved MEMS reliability," SENSORS, 2010 IEEE, Waikoloa, HI, USA, 2010, pp. 767-770. (Year: 2010).*

(Continued)

*Primary Examiner* — A. Dexter Tugbang
(74) *Attorney, Agent, or Firm* — BakerHostetler (57) ABSTRACT

A system for applying a coating to a substrate. The system includes a coating station for applying a coating material to the substrate, where the coating station has a bottom portion, an oven for curing the coating material on the substrate, where the oven is positioned vertically below the bottom portion, and a first lift for transporting the substrate from the coating station to the oven. The system can also include an inspection station for inspecting the substrate. Each of the separate elements of the coating system, including the coating station, first lift, oven, and inspection station can define self-contained modules.

24 Claims, 10 Drawing Sheets

(51) Int. Cl.
  *H05K 3/00* (2006.01)
  *H05K 3/28* (2006.01)
  *H01L 21/67* (2006.01)

(52) U.S. Cl.
  CPC .......... *H05K 3/28* (2013.01); *H01L 21/67178* (2013.01); *H05K 2203/0736* (2013.01); *H05K 2203/085* (2013.01); *H05K 2203/1366* (2013.01); *H05K 2203/1545* (2013.01); *H05K 2203/163* (2013.01)

(58) Field of Classification Search
  CPC ..... H05K 2203/0736; H05K 2203/085; H05K 2203/1366; H05K 2203/163; H05K 3/0091; H05K 2203/1545; H01L 21/67178; H01L 21/67739; H01L 21/67745
  See application file for complete search history.

(56) References Cited

U.S. PATENT DOCUMENTS

| | | | |
|---|---|---|---|
| 5,567,237 A | 10/1996 | Kapp-Schwoerer et al. | |
| 5,919,023 A | 7/1999 | Owens, Jr. | |
| 6,537,610 B1 * | 3/2003 | Springer | B05D 7/546 |
| | | | 427/470 |
| 6,699,329 B2 | 3/2004 | Mueller et al. | |
| 6,722,412 B2 | 4/2004 | Huang et al. | |
| 7,005,009 B2 | 2/2006 | Aoki et al. | |
| 8,613,134 B2 | 12/2013 | Doyle | |
| 9,184,071 B2 | 11/2015 | Ogura et al. | |
| 9,337,370 B2 | 5/2016 | Spotti et al. | |
| 9,674,963 B1 | 6/2017 | Sari et al. | |
| 9,719,725 B2 | 8/2017 | Stephens | |
| 2004/0081756 A1 | 4/2004 | Coots et al. | |
| 2006/0137213 A1 | 6/2006 | Asuke | |
| 2009/0165950 A1 * | 7/2009 | Kim | H01L 21/67778 |
| | | | 156/345.1 |
| 2010/0227082 A1 | 9/2010 | Fan et al. | |
| 2012/0084059 A1 * | 4/2012 | Akada | H01L 21/67745 |
| | | | 702/188 |
| 2012/0282713 A1 * | 11/2012 | Tanaka | H01L 21/67184 |
| | | | 156/345.24 |
| 2013/0343841 A1 * | 12/2013 | van der Meulen | |
| | | | H01L 21/67742 |
| | | | 414/217 |
| 2017/0273193 A1 | 9/2017 | Sari et al. | |

FOREIGN PATENT DOCUMENTS

| | | | | |
|---|---|---|---|---|
| JP | 2015099809 A | * | 5/2015 | ......... H01L 21/0273 |
| WO | 2002/043876 A1 | | 6/2002 | |
| WO | 2017/003820 A1 | | 1/2017 | |

OTHER PUBLICATIONS

Nordson, ASYMTEK Products, http://www.nordson.com/en/divisions/asymtek/products/conformal-coating-systems/select-coat-sl-940-conformal-coating-system, webpage accessed Aug. 26, 2020.

* cited by examiner

SYSTEMS FOR COATING A SUBSTRATE

CROSS REFERENCE TO RELATED APPLICATIONS

This application is a U.S. National Stage Application of International Patent Application No. PCT/US2018/059995, filed Nov. 9, 2018, which claims the benefit of U.S. Provisional Patent App. No. 62/584,259, filed Nov. 10, 2017, the entire disclosures of both of which are hereby incorporated by reference as if set forth in their entireties herein.

TECHNICAL FIELD

The present disclosure generally relates to applying a coating to a substrate and, more particularly, to a modular system for applying a coating to a substrate, curing the coating, and inspecting the substrate.

BACKGROUND

A variety of coating systems exist for applying a conformal coating to a substrate, such as a printed circuit board (PCB). A conformal coating is a thin layer of dielectric material that is applied to a substrate to provide environmental and mechanical protection to the circuitry on the board. The coating protects the circuitry from moisture and prevents short circuiting and corrosion of the metal conductors and soldered joints. The conformal coating also prevents or minimizes the dendritic growth (electrochemical migration) of metal at the soldered joints that could later result in short circuit. After the coating has been applied, the coating can be heat cured on the substrate using one or more ovens included in the coating system. Further, the coating can be manually inspected by an operator of the coating system or automatically inspected by an inspection station included in the coating system.

Conventional coating systems can include a conveyer that extends through each part of the coating system for moving the substrate from the beginning to the end of the coating process. As a result, such conveyers move the substrate along a substantially linear path through the coating system. Due to the size of certain parts of the coating system, particularly the long length of some ovens, conventional coating systems can be very long. These coating systems therefore define large footprints and likewise require a large floor space for operation.

As a result, there is a need for a coating system that defines a reduced footprint and therefore conserves floor space in a factory setting.

SUMMARY

An embodiment of the present disclosure includes a system for applying a coating to a substrate. The system includes a coating station for applying a coating material to the substrate, where the coating station has a bottom portion, and an oven for curing the coating material on the substrate, where the oven is positioned vertically below the bottom portion. The system also includes a first lift for transporting the substrate from the coating station to the oven.

Another embodiment of the present disclosure includes a method for applying a coating to a substrate. The method includes applying a coating material to the substrate with a coating station, transporting the substrate from the coating station to an oven in a vertically downward direction, and curing the coating on the substrate within the oven. The method also includes, after curing the coating, transporting the substrate from the oven in a vertically upward direction opposite the downward direction to an inspection station, and inspecting the substrate with the inspection station.

Another embodiment of the present disclosure includes a system for applying a coating to a substrate. The system includes a first self-contained module comprising a coating station for applying a coating material to the substrate and a second self-contained module comprising an oven for curing the coating material on the substrate, where the second self-contained module is adjacent to the first self-contained module. The system also includes a third self-contained module comprising a first lift for transporting the substrate from the first self-contained module to the second self-contained module, where the third self-contained module is adjacent to the first and second self-contained modules.

BRIEF DESCRIPTION OF THE DRAWINGS

The foregoing summary, as well as the following detailed description of illustrative embodiments of the present application, will be better understood when read in conjunction with the appended drawings. For the purposes of illustrating the present application, there is shown in the drawings illustrative embodiments of the disclosure. It should be understood, however, that the application is not limited to the precise arrangements and instrumentalities shown.

DETAILED DESCRIPTION OF ILLUSTRATIVE EMBODIMENTS

Described herein is a modular coating system 10 that includes a coating station 24 for applying a coating to a substrate 100 and an oven 34 for curing the coating positioned below the coating station 24. Certain terminology is used to describe the coating system 10 in the following description for convenience only and is not limiting. The words "right," "left," "lower," and "upper" designate directions in the drawings to which reference is made. The words "inner" and "outer" refer to directions toward and away from, respectively, the geometric center of the description to describe the coating system 10 and related parts thereof. The words "forward" and "rearward" refer to directions in a lateral direction 4 and a direction opposite the lateral direction 4 along the coating system 10 and related parts thereof.

The terminology includes the above-listed words, derivatives thereof, and words of similar import.

Unless otherwise specified herein, the terms "vertical" and "lateral" are used to describe the orthogonal directional components of various components of the coating system 10, as designated by the vertical direction 2 and lateral direction 4. It should be appreciated that while the vertical and lateral directions 2 and 4 are illustrated as extending along a vertical plane, the plane that encompasses the various directions may differ during use.

Figure 1:
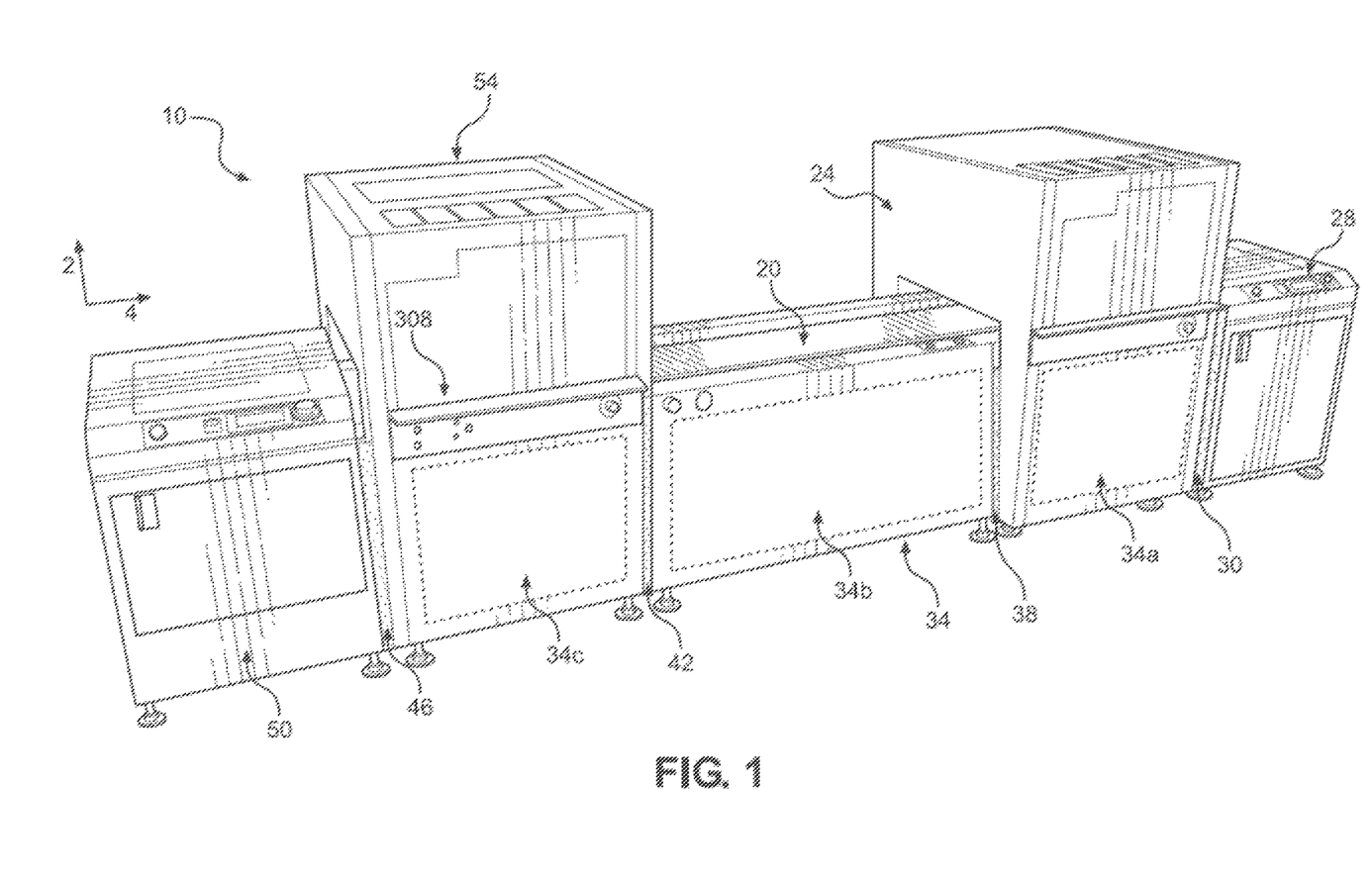
FIG. 1 is a perspective view of a coating system according to an embodiment of the present disclosure.
Figure 4:
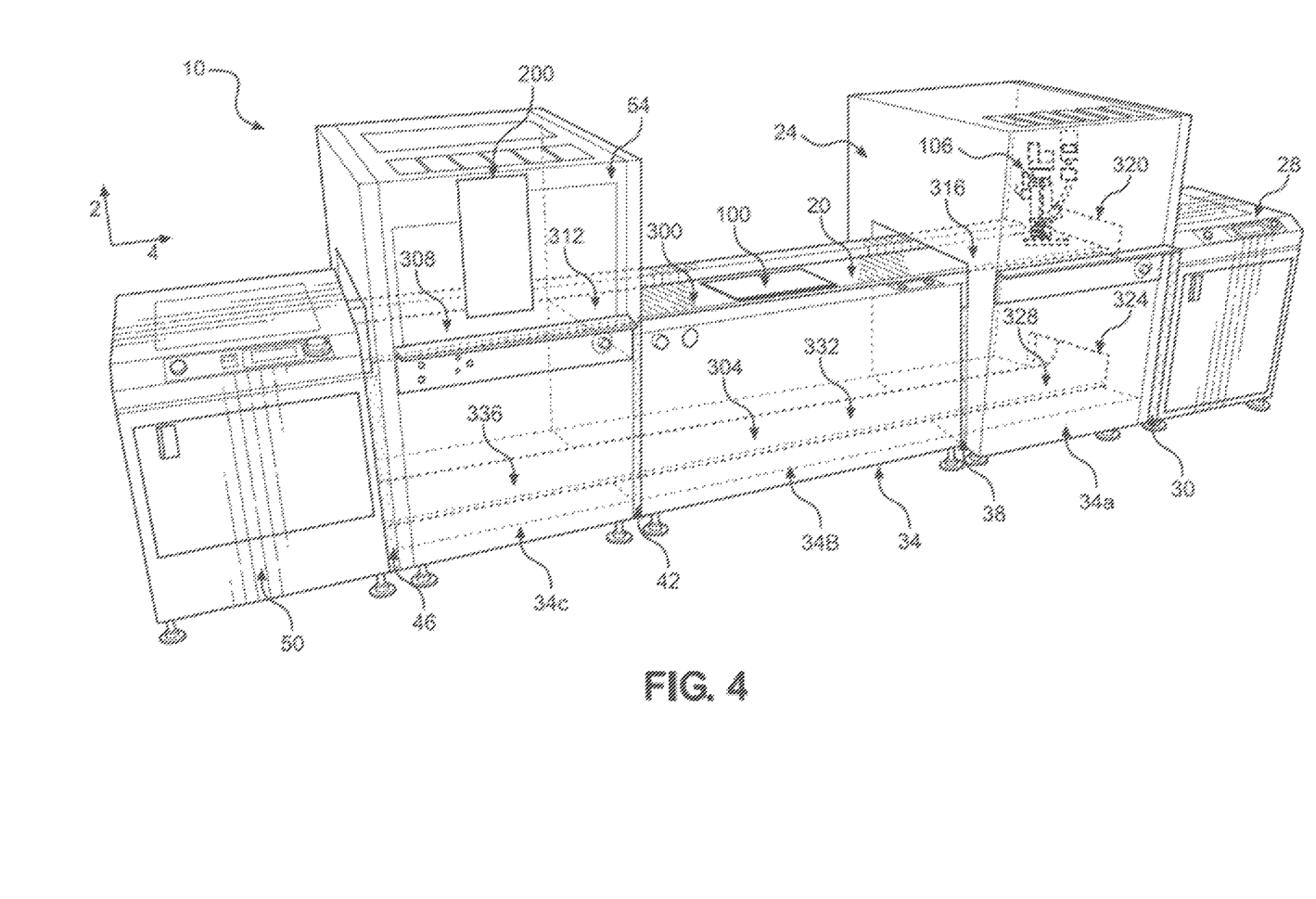
FIG. 4 is a perspective view of the coating system shown in FIG. 1, with some elements removed for clarity.
Figure 5:
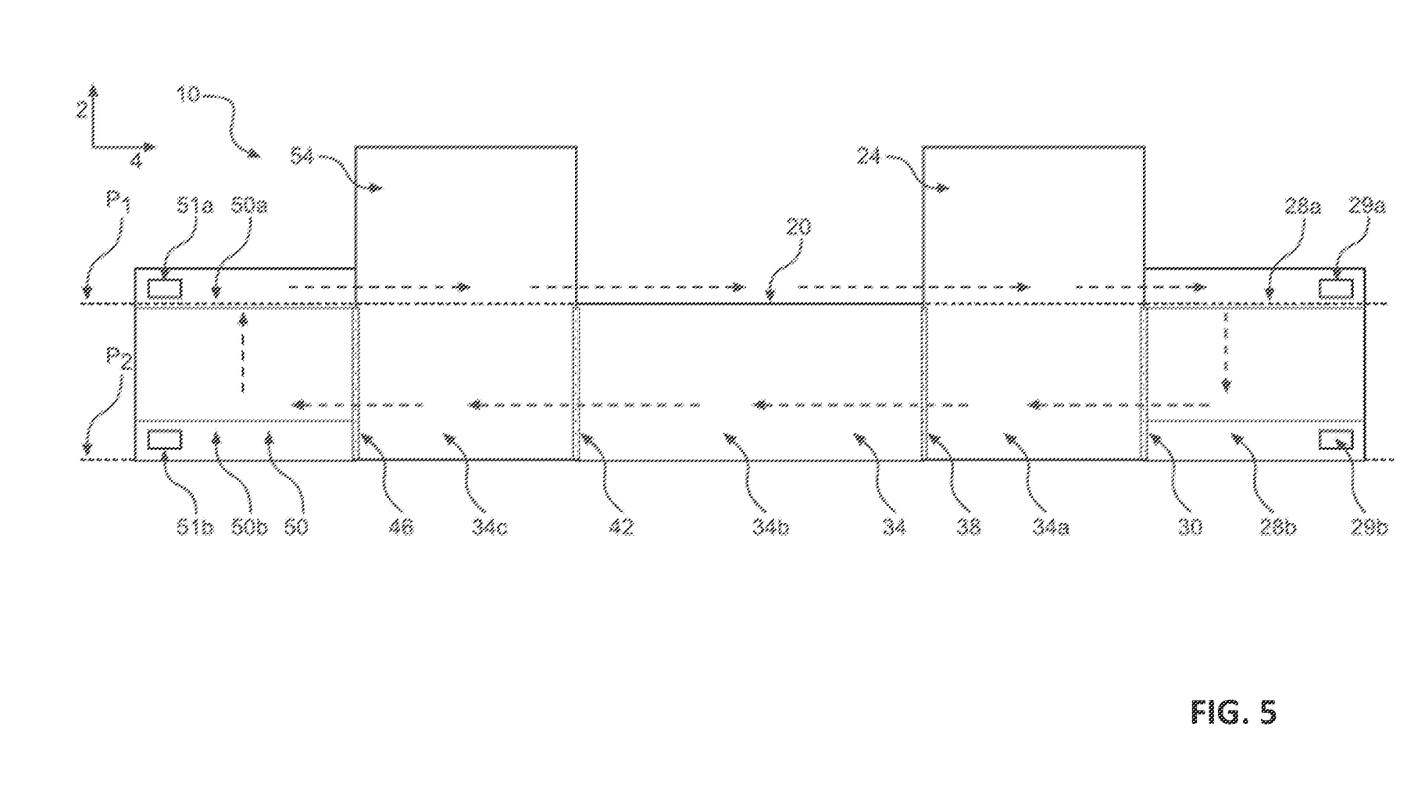
FIG. 5 is a schematic diagram of the coating system shown in FIG. 1.

Referring to FIGS. 1, 4, and 5, the coating system 10 is a modular assembly of removable and interchangeable components for applying a coating material to a substrate 100, curing the coating 102, and inspecting the substrate 100. The substrate 100 may be a printed circuit board (PCB), or may comprise any other type of substrate as desired. The coating system 10 includes a loading area 20 for adding an uncoated substrate 100 to the coating system 10 and removing a coated substrate 100 from the coating system 10. The substrate 100 can be added to and removed from the loading area 20 manually by an operator of the coating system 10, or automatically from a loading machine. The coating system 10 can include an upper conveyer system 300 for transporting the substrate 100 between various components of the coating system 10 disposed above a first plane $P_1$, as will be described below. Specifically, the loading area 20 can include a second section 312 of the upper conveyer system 300 that transports the substrate 100 from the loading area 20 to a coating station 24, which can be located immediately to the right of the loading area 20 along the lateral direction 4. In the depicted embodiment, each section of the upper conveyer system 300 is an endless conveyer, though other embodiments of conveyer systems are contemplated.

Figure 2:
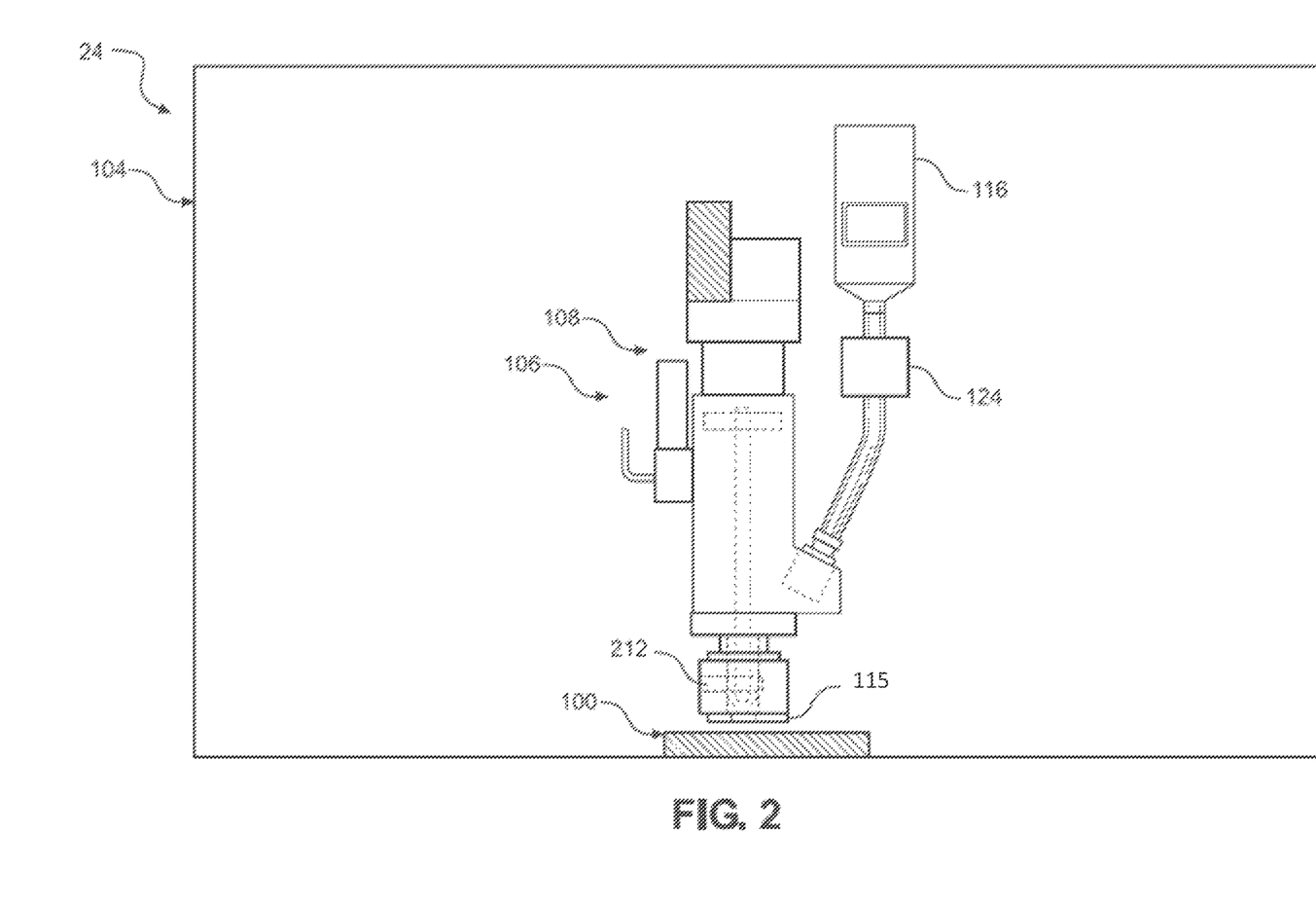
FIG. 2 is a side cross-sectional view of a coating station of the coating system shown in FIG. 1.

Referring to FIG. 2, the coating system 10 can include a coating station 24 for applying a coating to the substrate 100. The coating station 24 can include a housing 104 and an applicator assembly 106 configured to be disposed within the housing 104. The bottom portion of the housing 104 defines a plane $P_1$ that is parallel to the lateral direction 4. The applicator assembly 106 includes an applicator 108 that is in fluid communication with a material source 116, and is configured to move coating material (not shown) from the material source 116 to form a coating 102 on the substrate 100. The coating material can be acrylic, polyurethane, silicone, or other types of materials typically used for coating substrates. The applicator 108 can comprise a jetting dispenser, contact dispenser, air or airless spray applicator, or other type of applicator as desired. The amount of coating material moved through the applicator 108 to the substrate 100 can be monitored by a flow meter 124. In the depicted embodiment, the flow meter 124 is disposed on a portion of the applicator 108, such as the applicator tip 115, so that the flow meter 124 can measure how much coating material passes from the applicator 108 to the substrate 100. In another embodiment, the flow meter 124 can be disposed at the coating material source 116 or between the material source 116 and the applicator 108. Alternatively, a plurality of flow meters can be positioned at multiple locations within the applicator assembly 106.

The flow meter 124 can measure one or more parameters of the flow of coating material as it flows from the material source 116. In some embodiments, the flow meter 124 can measure the volume, velocity, pressure, and/or the duration of the flow. The flow meter can be connected to a controller 402, where the controller 402 is configured to receive data from the flow meter 124 and perform analysis on the data. The controller 402 can also be configured to analyze other parameters of the flow, such as the type of coating material, the characteristics of the applicator 108, and/or characteristic of other portions of the coating system 10. In addition to the flow meter 124, the applicator assembly 106 can also include other types of sensors for detecting aspects of the coating material, such as a solvent sensor. Though one embodiment of an applicator assembly 106 is described above, it is contemplated that the coating station 24 can include various other types of applicator assemblies 106 as desired, depending on the type of substrate 100 to be coated or the type of coating operation to be performed. Due to the modular nature of the coating system 10, the particular coating station 24 described above can be easily removed from the coating system 10 and replaced with another coating station with little to no impact on the rest of the coating system 10. Though described as including an applicator configured for conformal coating, the coating station 24 can alternatively include applicators configured to perform other varieties of dispensing methods. For example, the coating station 24 can include an applicator configured to perform dispensing methods such as underfill, encapsulation, dam and fill, or other operations as desired.

Continuing with FIGS. 1, 4, and 5, the coating station 24 can also include a third section 316 of the upper conveyer system 300. The third section 316 is configured to receive the substrate 100 from the loading area 20, and move the substrate 100 so that it is positioned appropriately for receiving the coating material from the applicator assembly 106. After the coating station 24 has applied the coating 102 to the substrate 100, the third section 316 of the upper conveyer system 300 moves the substrate 100 to the first lift 28, which is configured to transport the substrate 100 downward along the vertical direction 2 to the oven 34.

The first lift 28 is configured to receive the substrate 100 from the coating station 24, particularly the third section 316 of the upper conveyer system 300, through a first lift entrance 320 defined by a side of the first lift 28 that faces the coating station 24. The substrate 100 is received from the coating station 24 by an upper chamber 28a of the first lift 28, which is situated at the top of the first lift 28. Once the substrate 100 is fully within the upper chamber 28a, a sensor 29a within the upper chamber 28a can sense the position of the substrate 100 and notify the controller 402. The controller 402 then directs the first lift 28 to transport the substrate 100 from the upper chamber 28a downward along the vertical direction 2 to a lower chamber 28b of the first lift 28. The lower chamber 28b is positioned at the bottom of the first lift 28 opposite the upper chamber 28a. As a result, the lower chamber 28b is positioned entirely below the first plane $P_1$, while the upper chamber 28a is positioned above the first plane $P_1$. Once the substrate 100 is entirely disposed within the lower chamber 28b, a sensor 29b disposed within the lower chamber 28b notifies the controller 402, which instructs the first lift 28 to move the substrate 100 from the lower chamber 28b to the oven 34 through the first lift outlet 324.

The oven 34 is entirely disposed below the first plane $P_1$, and can be modular and include a plurality of separate ovens 34a-34c. The oven 34 includes a lower conveyer system 304 for moving the substrate 100 from the first lift 28 to the second lift 50 through the oven 34. In one embodiment, each part of the lower conveyer system 304 can be an endless conveyer, though other types of conveyers are also contemplated. Additionally, each oven of the oven 34 is configured to be heated to a predetermined temperature. As depicted, the oven 34 includes a first oven 34a disposed immediately to the left of the first lift 28 along the lateral direction 4.

Additionally, the first oven 34a is positioned entirely and immediately below the coating station 24 along the vertical direction 2. The interior of the first oven 34a can be raised to and maintained at a first temperature for heat curing the coating 102 applied to the substrate 100. For example, the first oven 34a can be raised to a temperature that is from about 60 degrees Celsius to about 130 degrees Celsius. The coating system 10 can include a seal 30 disposed between the first lift 28 and the first oven 34a for creating a thermal seal between the first lift 28 and the first oven 34a. The seal 30 can prevent heat from the first oven 34a from escaping to the first lift 28, as well as from the first oven 34a to the environment in which the coating system 10 is located. The seal 30 can comprise Viton, silicone, or other materials that can withstand the temperatures encountered in the oven 34. Alternatively, the seal 30 can be a metal flange. The seal 30 can define part of the first oven 34a or the first lift 28, or can be releasably attached to the first oven 34a and the first lift 28, such that the seal 30 can be used with other configurations of components in the coating system 10. The first oven 34a can include a first section 328 of the lower conveyer system 304 for moving the substrate 100 from the first lift 28 through the first oven 34a. Once the substrate 100 passes through the first oven 34a on the first section 328 of the lower conveyer system 304, the substrate 100 can enter a second oven 34b disposed immediately to the left of the first oven 34a along the lateral direction 4.

The second oven 34b is disposed immediately to the left of the first oven 34a along the lateral direction 4. Additionally, the second oven 34b is positioned entirely and immediately below the loading area 20. The interior of the second oven 34b can be raised to and maintained at a second temperature for further heat curing the coating 102 applied to the substrate 100. For example, the second oven 34b can be raised to a temperature that is from about 60 degrees Celsius to about 130 degrees Celsius. The second temperature of the second oven 34b may be the same as or different than the first temperature of the first oven 34a. The coating system 10 can include a seal 38 disposed between the second oven 34b and the first oven 34a for creating a thermal seal between the first oven 34a and the second oven 34b. The seal 38 can prevent the heat levels within each of the first and second ovens 34a and 34b from affecting each other, as well as prevent heat from escaping from the first and second ovens 34a and 34b to the external environment. The seal 38 can be similarly configured as the seal 30, or can be different as desired. Further, the seal 38 can define part of the first or second ovens 34a and 34b, or can be releasably attached to the first and second ovens 34a and 34b, such that the seal 38 can be used with other configurations of components in the coating system 10. The second oven 34b can include a second section 332 of the lower conveyer system 304 for moving the substrate 100 from the first oven 34a through the second oven 34b. Once the substrate 100 passes through the second oven 34b on the second section 332 of the lower conveyer system 304, the substrate 100 can enter a third oven 34c disposed immediately to the left of the second oven 34b along the lateral direction 4.

The third oven 34c is disposed immediately to the left of the second oven 34b along the lateral direction 4. Additionally, the third oven 34c is positioned entirely and immediately below the inspection station 54, which will be described further below. The interior of the third oven 34c can be raised to and maintained at a third temperature for further heat curing the coating 102 applied to the substrate 100. For example, the third oven 34c can be raised to a temperature that is from about 60 degrees Celsius to about 130 degrees Celsius. The third temperature of the third oven 34c can be the same as or different than the first and/or second temperatures. The coating system 10 can include a seal 42 disposed between the third oven 34c and the second oven 34b for creating a thermal seal between the third oven 34c and the second oven 34b. The seal 42 can prevent heat levels within each of the second and third ovens 34b and 34c from affecting each other, as well as prevent heat from escaping from the second and third ovens 34b and 34c to the external environment. The seal 42 can be similarly configured to the seals 30 and/or 38, or can be different as desired. Further, the seal 42 can define part of the second or third ovens 34b and 34c, or can be releasably attached to the second and third ovens 34b and 34c, such that the seal 42 can be used with other configurations of components in the coating system 10. The third oven 34c can include a third section 336 of the lower conveyer system 304 for moving the substrate 100 from the second oven 34b through the third oven 34c.

Though the oven 34 is described as including three ovens 34a-34c, the modular nature of the coating system 10 allows more ovens to be attached to the coating system 10 to accommodate different types of substrates, coating materials, coating operations, etc. without significantly affecting the rest of the coating system 10. Likewise, any of the ovens 34a-34c can be removed as desired. For example, the oven 34 can include only one oven. Though described as being capable of raising to a certain temperature, each of the ovens 34a-34c can internally define multiple temperature zones, such that each of the ovens 34a-34c can be simultaneously raised to a plurality of temperatures. Each additional oven can be similarly configured as the ovens 34a-34c already described, or can be alternatively configured as desired. Each additional oven can also include an additional conveyer portion that will comprise part of the lower conveyer system 304. Regardless of the number of ovens that comprise the oven 34, the lower surface of any of the ovens of the oven 34 can define a second plane $P_2$ that is parallel to the lateral direction 4. The second plane $P_2$ is spaced from the first plane $P_1$ along the vertical direction 2. The lower surfaces of the other ovens of the oven 34 can also be substantially disposed on the second plane $P_2$.

Once the substrate 100 passes through the third oven 34c, the substrate 100 can enter the second lift 50 disposed immediately to the left of the third oven 34c. The second lift 50 is configured to receive the substrate 100 from the oven 34 through a second lift entrance (not shown) and transport the substrate 100 upward along the vertical direction 2 to the inspection station 54. The substrate 100 passes through the second lift entrance defined by a side of the second lift 50 that faces the oven 34. The coating system 10 can include a seal 46 disposed between the third oven 34c and the second lift 50 for creating a thermal seal between the third oven 34c and the second lift 50. The seal 46 can prevent heat levels within the third oven 34c from affecting operation of the second lift 50, as well as prevent heat from escaping from the third oven 34c to the external environment. The seal 46 can be similarly configured to the seals 30, 38, and/or 46, or can be different as desired. Further, the seal 46 can define part of third oven 34c and the second lift 50, or can be releasably attached to the third oven 34c and the second lift 50, such that the seal 46 can be used with other configurations of components in the coating system 10.

The substrate 100 is received from the oven 34 within a lower chamber 50b of the second lift 50, which is situated at the bottom of the second lift 50. Once the substrate 100 is fully within the lower chamber 50b, a sensor 51b within the lower chamber 50b can sense the position of the substrate 100 and notify the controller 402. The controller 402 then directs the second lift 50 to transport the substrate 100 from the lower chamber 50b upward along the vertical direction 2 to an upper chamber 50a of the second lift 50. The upper chamber 50a is positioned at the top of the second lift 50 opposite the lower chamber 50b. As a result, the upper chamber 50a is positioned entirely above the first plane $P_1$, while the lower chamber 50b is positioned below the first plane $P_1$. Once the substrate 100 is entirely disposed within the upper chamber 50a, a sensor 51a disposed within the upper chamber 50a notifies the controller 402, which instructs the second lift 50 to move the substrate 100 from the upper chamber 50a to the inspection station 54.

Figure 3A:
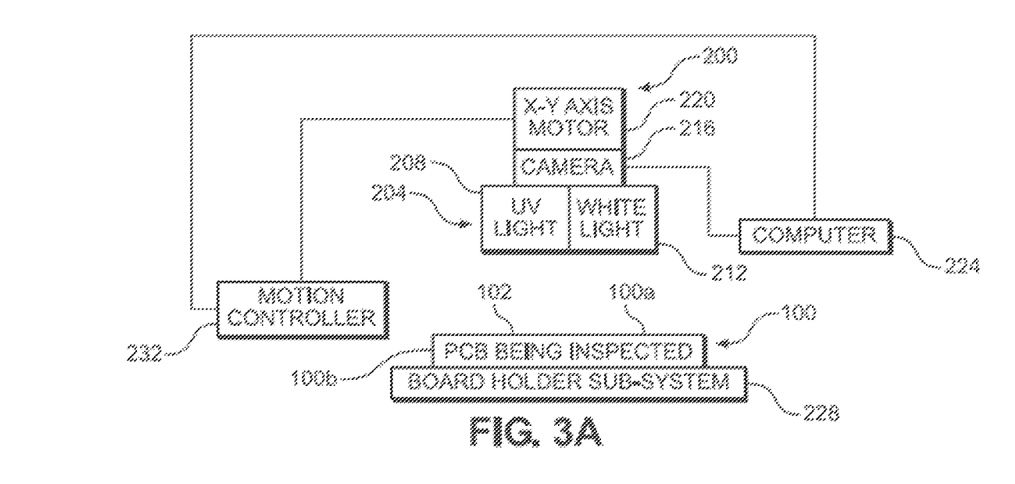
FIG. 3A is a schematic diagram of an inspection station of the coating system shown in FIG. 1.
Figure 3B:
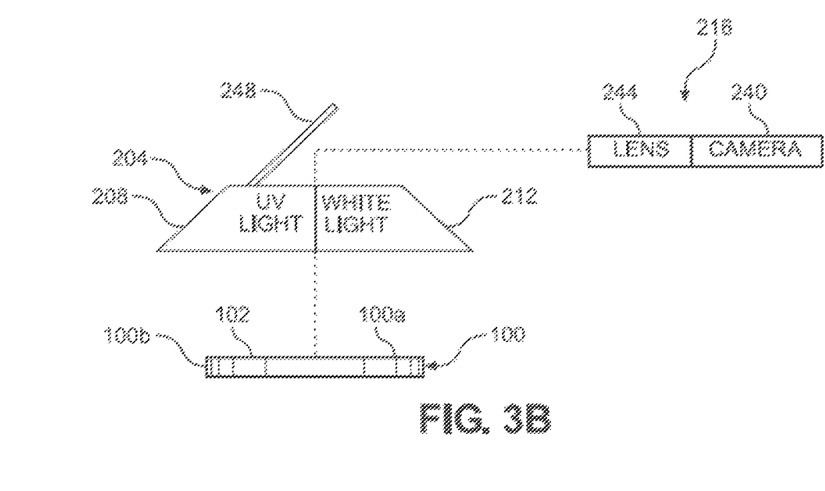
FIG. 3B is a schematic diagram of an inspection station of the coating system shown in FIG. 1.

Continuing with FIGS. 3A-3B, the inspection station 54 includes an inspection system 200. The inspection system 200 can include a lighting sub-system 204 that has an ultraviolet (UV) light source 208 that directs UV light onto the coating 102. The coating 102 can include a tracer that fluoresces in the presence of the UV light. The lighting sub-system 204 also can include an optional white light source 212 that directs white light onto the coating 102 of the substrate 100. The inspection system 200 further includes a camera sub-system 216 that includes a camera 240. The camera 240 has a lens 244 positioned above the substrate 100 for capturing one or more images of the illuminated substrate 100 when light is emitted onto the substrate 100. Specifically, the camera 240 can be angled or positioned perpendicular to the confronting surface 100a of the substrate 100. When positioned perpendicular to the confronting surface 100a, as shown in FIG. 3B, the inspection system 200 can include an angled mirror 248. Though depicted in FIG. 3A as being situated above the substrate 100 and in FIG. 3B as perpendicular to the substrate 100, the camera 240 can be angled, e.g., at a 45° angle, relative to the confronting surface 100a of the substrate 100 so that the lens 244 captures one or more edge images of an outer edge 100b of the illuminated substrate 100. The images from the camera 240 are conveyed to an image-processing computer 224, which can be the controller 402, for determining whether the substrate 100 is properly coated. Alternatively, the image-processing computer 224 can be separate from but in electronic communication with the controller 402.

The inspection station 54 can also include a board holder sub-system 228 that comprises the first section 308 of the upper conveyer system 300. The first section 308 can be configured to hold the substrate 100 about one or more of its edges during inspection. In another embodiment, the board holder sub-system 228 can include support pins (not shown) that holds the substrate 100 during inspection. The first section 308 transports the substrate 100 from the second lift 50 to the loading area 20, which can be located immediately to the right of the inspection station 54 along the lateral direction 4. To adjust the position of the camera 216, the camera 216 can be connected to an X-Y axis motor 220. The X-Y axis motor 220 is configured to move the camera 216 relative to the substrate 100 upon receiving instructions from a motion controller 232 and/or the image-processing computer 224. The motion controller 232 can be the controller 402, or can alternatively be separate from but in electronic communication with the controller 402. Though one type of inspection device is described, the inspection station 54 can include various other types of inspection devices as desired, such as an optical 3D scanner, 2D laser profiler, or 3D laser profiler. Alternatively, the coating system 10 may not include the inspection station 54, but can rather include a manual or semi-automatic inspection station (not shown) where the operator of the coating system 10 must verify the coating quality of each substrate 100.

Each of the separate elements of the coating system 10, including the coating station 24, first lift 28, oven 34 (and likewise first, second, and third ovens 34a-34c), second lift 50, and inspection station 54 can define self-contained, independently separable modules. As a result, each of these modules can be individually removed from and/or reorganized within the coating system 10 without affecting the configuration of other modules of the coating system 10. For example, though the coating station 24 is depicted as disposed on top of the first oven 34a, the coating station 24 or the first oven 34a can be removed from the coating system 10 without affecting the other module. Likewise, though the inspection station 54 is depicted as disposed on top of the third oven 34c, the inspection station 54 of the third oven 34c can be removed from the coating system 10 without affecting the other module. Due to this modular construction, the coating system 10 can include other modular stations not already mentioned, such as a vacuum chamber for removing bubbles from a coating material, an atmospheric or vacuum plasma system for substrate surface treatment, or other modules as desired.

FIGS. 6A-D illustrate coating systems 111, 112, 113, and 114, respectively.

The coating systems 111, 112, 113, and 114 may serve as alternative embodiments or configurations of the coating system 10 shown in FIGS. 1, 4, and 5. The coating system 111, 112, 113, and 114 demonstrate the modular nature of the coating systems described herein. That is, various coating system components described herein (e.g., a coating station 24, an oven 34, an inspection station 54, a loading area 20, a lift 28, etc.) and/or modules may be added (including additional instances of a component/module) or omitted according to particular needs. Further, the various components and/or modules may be configured in various sequential orderings according to particular needs. The coating systems 111, 112, 113, and 114 may be similar in some aspects to the coating system 10. Accordingly, like reference numerals in the figures shall refer to like elements.

Figure 6A:
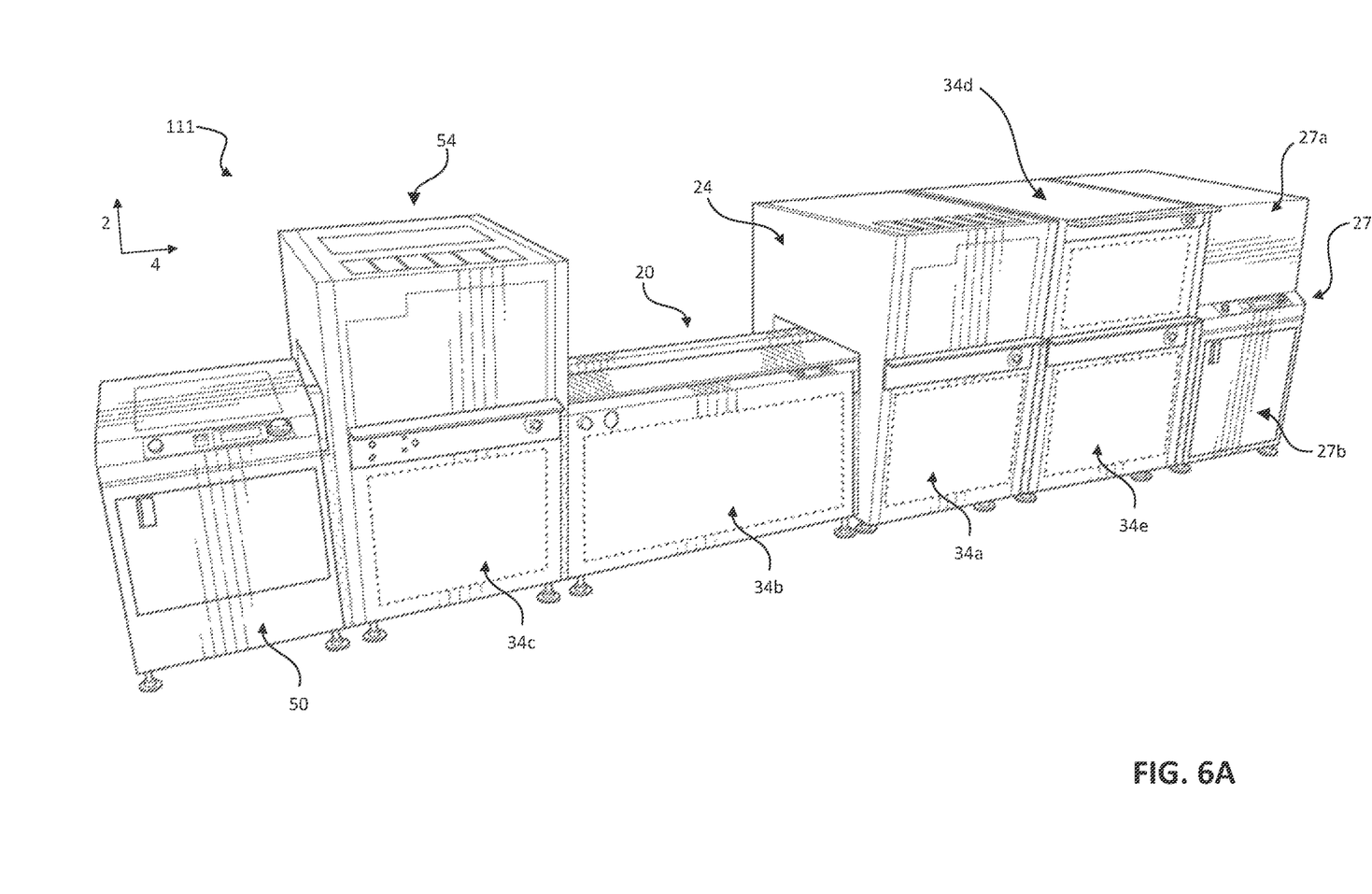
FIG. 6A is a perspective view of a coating system according to an embodiment of the present disclosure.

Referring to FIG. 6A, the coating system 110 includes a loading area 20 where a substrate is initially loaded prior to processing. The substrate proceeds to a coating station 24 to undergo a coating operation. The coated substrate is subsequently conveyed to a fourth oven 34d to begin a curing process of the coated substrate. The fourth oven 34d may form a module with a fifth oven 34e below. The temperatures of the fourth oven 34d and the fifth oven 34e may be separately and independently controller. From the fourth oven 34d, the coated substrate passes to a lift 27. The lift 27 may be similar in some aspects to the lift 28 of FIGS. 1, 4, and 5. The lift 27 comprises an upper section 27a configured to initially receive the substrate. The substrate is lowered to a lower section 27b of the lift 27. The lift 27 may be insulated and/or heated to keep the substrate from cooling during transport between the fourth oven 34d and the fifth oven 34e. The upper section 27a is located on the upper plane of the coating system 111 and the lower section 27b is located on the lower plane of the coating system 111. From the lower section 27b of the lift 27, the coated substrate passes sequentially through a fifth oven 34e, a first oven 34a, a second oven 34b, and a third oven 34c to complete the curing process. The substrate is brought to the upper plane by a lift 50. The substrate is positioned in an inspection station 54 for inspection, such as inspection of the coating applied to the substrate. The inspected substrate is thereafter unloaded at the loading area 20.

Figure 6B:
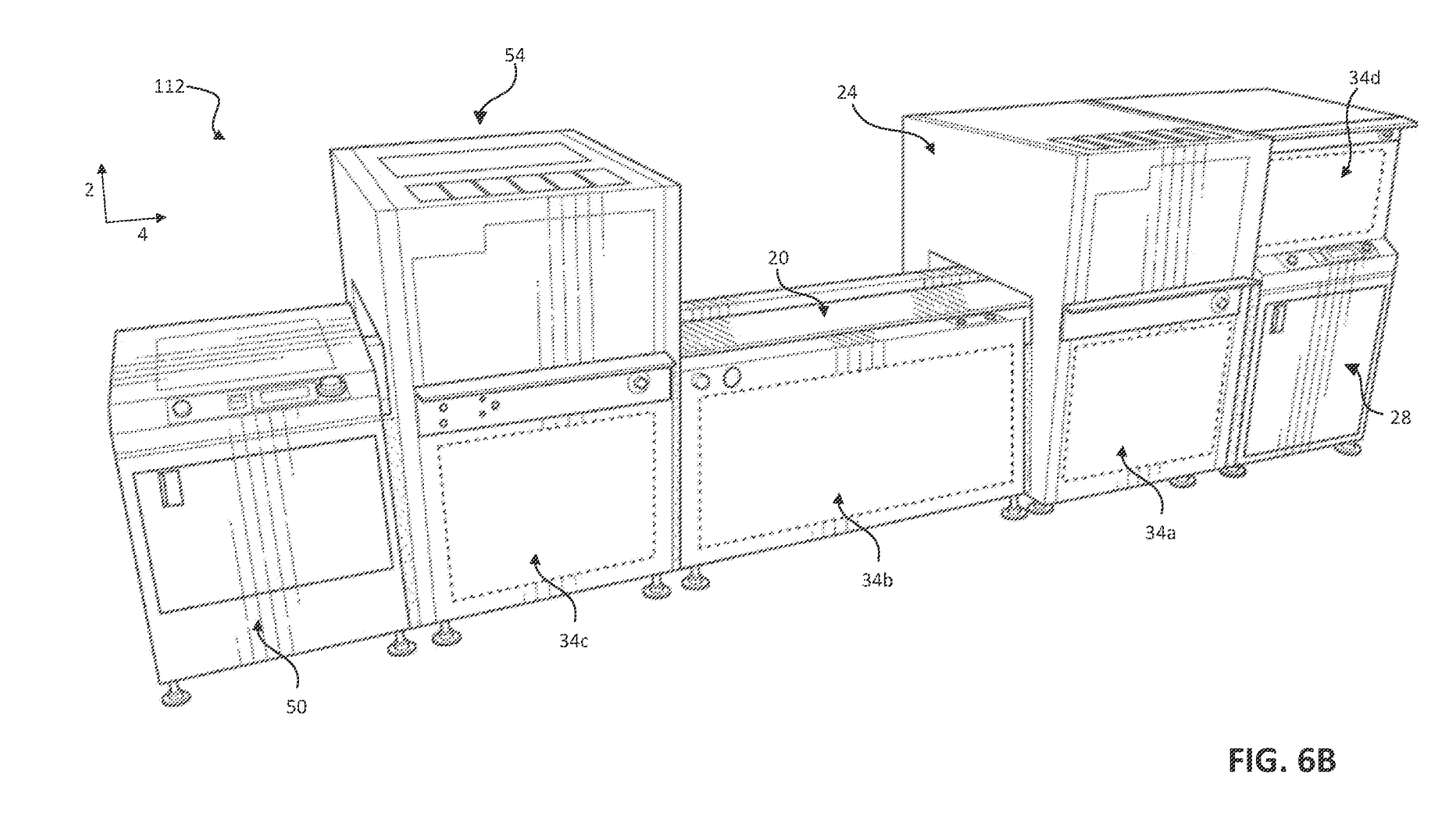
FIG. 6B is a perspective view of a coating system according to an embodiment of the present disclosure.

Referring to FIG. 6B, the coating system 112 comprises a loading area 20 to receive an uncoated substrate. The substrate is passed to a coating station 24 to be coated. The coated substrate is then brought to a fourth oven 34d, which forms the upper portion of a vertical stack with a lift 28. The substrate is lowered from the fourth oven 34d by the lift to the lower plane of the coating system 112. The substrate is thereafter passed sequentially through a first oven 34a, a second oven 34b, and a third oven 34c for completion of the curing process of the coated substrate. The substrate is then moved to another lift 50 to raise the substrate from the lower plane to the upper plane of the coating system 111. On the upper plane, the substrate is inspected at an inspection station 54 and removed from the coating system at the loading area 20.

Figure 6C:
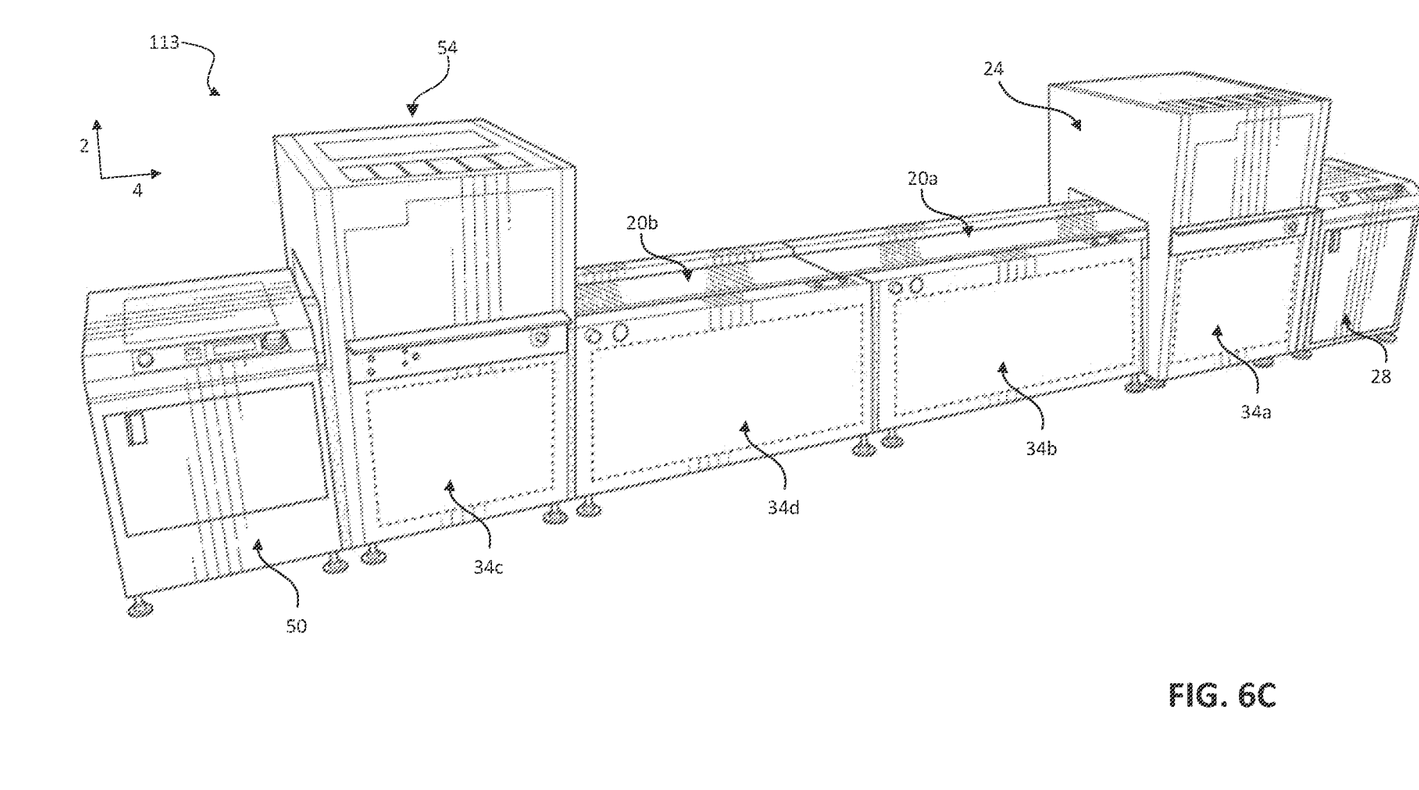
FIG. 6C is a perspective view of a coating system according to an embodiment of the present disclosure.

Referring to FIG. 6C, the coating system 113 comprises an initial loading area 20a for receiving an uncoated substrate. The received substrate is brought to a coating station 24 to be coated. The coated substrate is lowered from the upper plane of the coating system 113 to the lower plane of the coating system 113 by a lift 28. The coated substrate is cured while passing sequentially through the a first oven 34a, a second oven 34b, a fourth oven 34d, and a third oven 34c. The component containing the fourth oven 34d is configured with an unloading area 20b situated above the fourth oven 34d. The cured substrate is passed from the third oven 34c to a lift 50, which raises the substrate to the upper plane of the coating system 113. The substrate is thereafter conveyed to an inspection station 54 for inspection, such as inspection of the coating as applied to the substrate. Following inspection, the substrate is moved to the unloading area 20b for unloading, such as by a human operator or a robotic appendage.

Figure 6D:
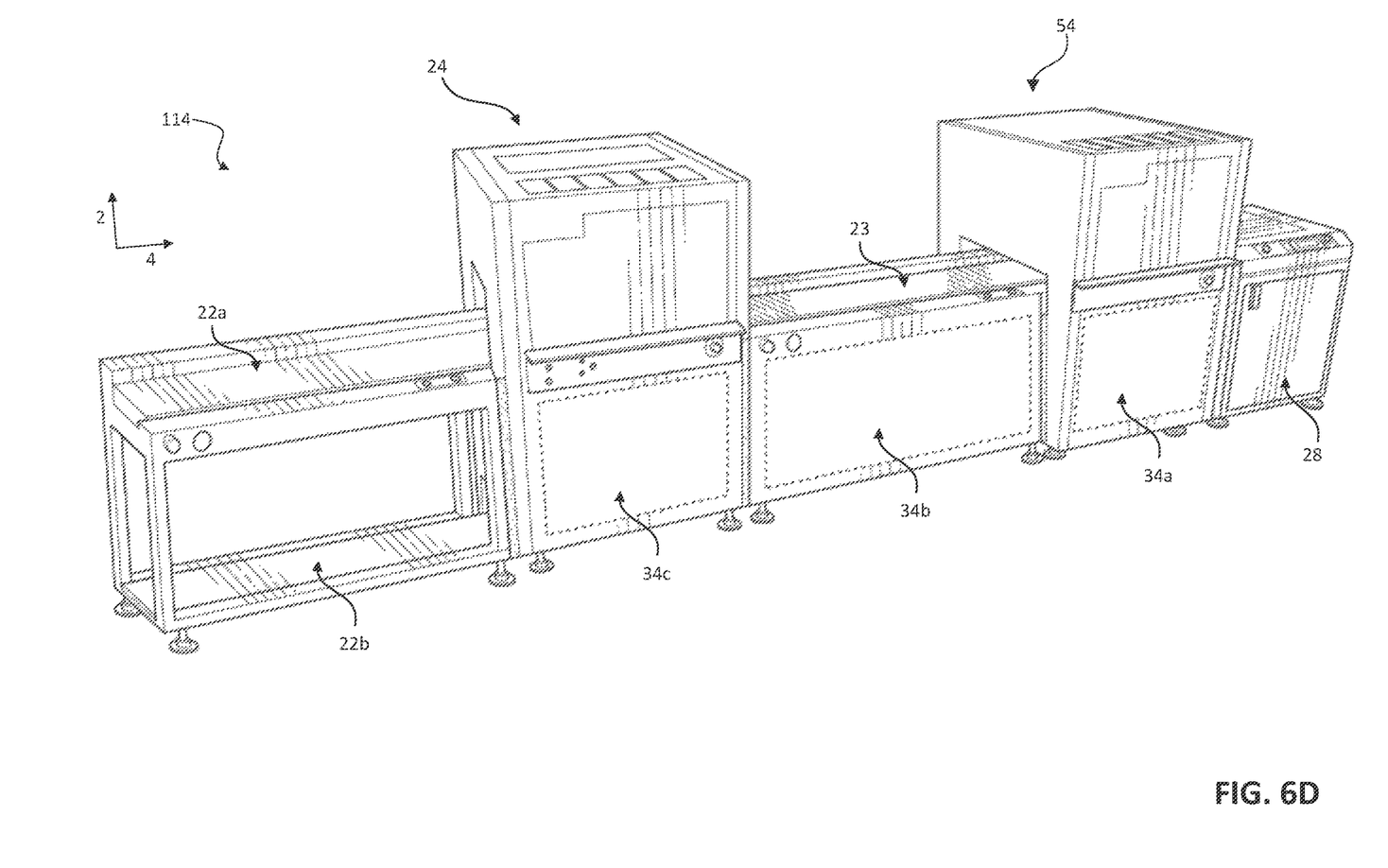
FIG. 6D is a perspective view of a coating system according to an embodiment of the present disclosure.

Referring to FIG. 6D, the coating system 114 is configured with a loading area 22a (similar in some aspects with the loading area 20 of FIGS. 1, 4, and 5) at an end of the linear assembly of the coating system 113. The substrate initially passes to a coating station 24 to undergo a coating process. The coated substrate is moved over a conveyance area 23 to an inspection station 54, which may inspect the coating on the substrate before it is cured. Following inspection, the substrate is lowered from the upper plane of the coating system 114 to the lower plane by a lift 28. On the lower plane, the coating on the substrate is cured by moving the substrate through a first oven 34a, a second oven 34b, and a third oven 34c. After final curing at the third oven 34c, the substrate is transferred to an unloading area 22b. The lower unloading area 22b is part of the same vertical component as the upper loading area 22a.

Further embodiments (not illustrated) are also contemplated. An embodiment may comprise a coating station 24 and/or an inspection station 54 positioned on the lower plane of a coating system, which may be additional or alternative to a coating station 24 or inspection station 54 positioned on the upper plane of the coating system. For example, an embodiment may be configured similarly to that shown in FIGS. 1, 4, and 5, but the third oven 34c is replaced with another inspection station 54. That is, the module comprising the inspection station 54 positioned above the third oven 34c, as shown in FIGS. 1, 4, and 5, may be swapped with a module comprising a first inspection station 54 positioned on the upper plane and above a second inspection 54 on the lower plane.

As another example, an embodiment may be configured similarly to the coating system 114 show in FIG. 6D, but the third oven 34c is replaced with another inspection station 54 in addition to the initial inspection station 54 over the first oven 34a. Thus, the module initially comprising the coating station 24 in FIG. 6D may be re-configured to comprise the coating station 24 on the upper plane of the coating system 114 and a second inspection station 54 on the lower plane. A coating system so-configured may allow for an initial inspection of the coating by the first inspection station 54 (above the first oven 34a) before it is cured by the first oven 34a and the second oven 34b. The cured coating on the substrate may be then inspected by the second inspection station 54 positioned below the coating station 24.

The coating systems described herein may comprise (e.g., a module may comprise) a drying component and/or a flash-off component. For example, an embodiment may be similar to the coating system 10 shown in FIGS. 1, 4, and 5, but the first oven 34a may be replaced with a drying component or a flash-off component. As such, a coating initially applied to a substrate by the coating station 24 may be allowed to dry before the coating is cured by the second oven 34b and the third oven 34c. A drying component and/or a flash-off component may be positioned on either of the upper plane or the lower plane of a coating system.

Figure 7:
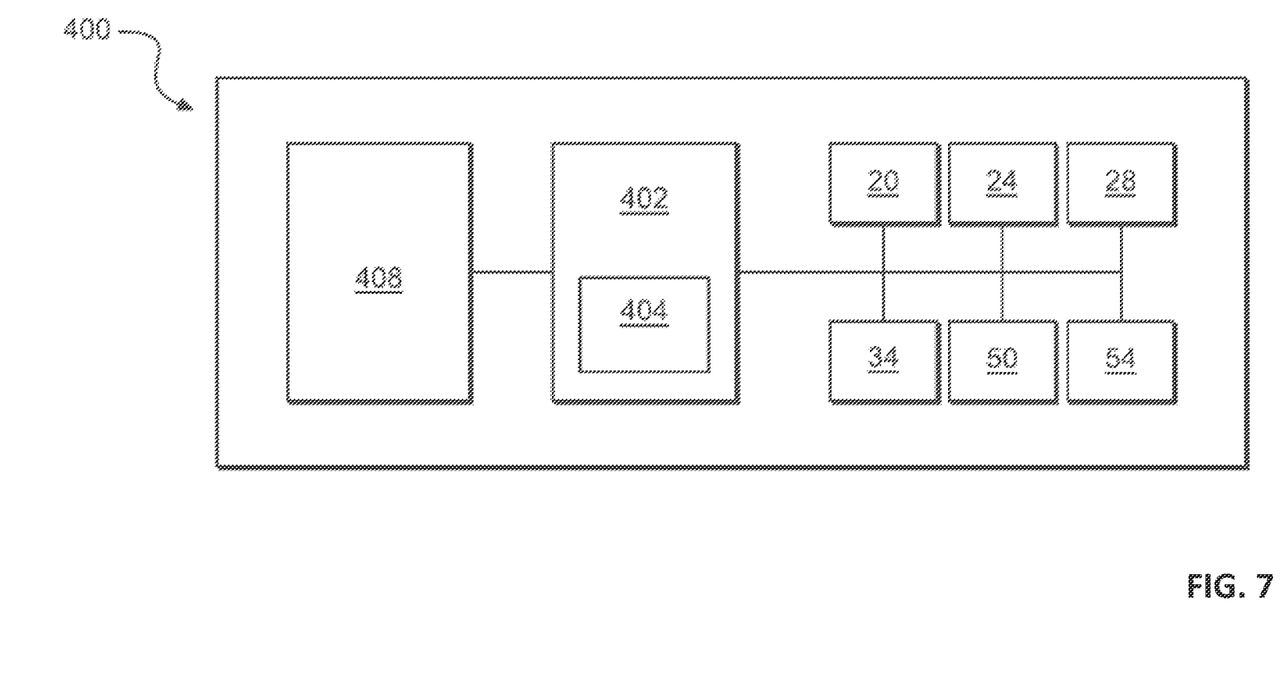
FIG. 7 is a schematic diagram of a control system according to an embodiment of the present disclosure.

Referring to FIG. 7, the coating system 10 can be controlled by a control system 400 including a controller 402 and/or an HMI device 408 in communication with the controller 402. The controller 402 may include one or more controllers and may also be referred to as one or more processors. The controller 402 can include the image-processing computer 224, or be separate from but in electronic communication with the image-processing computer 224. As shown in FIG. 7, the controller 402 and/or the HMI device 408 can be in wired and/or wireless connection with each aspect of the coating system 10, such as the loading area 20, coating station 24, first lift 28, oven 34, second lift 50, and inspection station 54, and are configured to transmit instructions to each of these aspects of the coating system 10, through the wireless and/or wired connection. The controller 402 can also be easily connected to additional modules added to the coating system 10 over time. The controller 402 can be a programmable logic controller (PLC), a microprocessor based controller, a personal computer, or another conventional control device capable of carrying out the functions described herein as understood by a person having ordinary skill in the art. For example, the controller 402 can perform the various methods relating to controlling the coating system 10 based upon user input, as described in detail below. Additionally, the controller 402 can perform the various methods related to controlling the coating system 10 based upon a library of operational cycles or sequences that are stored in a memory unit 404 of the controller 402. The memory unit 404 may include one or more memory units, and may also be referred to as a storage device. The operational sequences are recalled and placed in a particular control program, as desired, executing on the controller 402. The operational sequences can be adjusted to accommodate different dispensing operations, different types of substrates, or different types of material, for example through the HMI device 408.

The HMI device 408 is operatively connected to the controller 402 in a known manner. The HMI device 408 may include input devices and controls, such as a keypad, pushbuttons, control knobs, a touch screen, etc., and output devices, such as displays and other visual indicators, that are used by an operator to control the operation of the controller 402 and, thereby, control the operation of the coating system 10. The HMI device 408 may further include an audio output device, such as a speaker, by which an audio alert may be communicated to an operator. Using the HMI device 408, an operator can enter parameters such as type of coating material, type of substrate 100, desired coating pattern, and desired temperature of the oven 34, etc. Additionally, the controller 402 and/or the HMI device 408 can be in wired and/or wireless communication with an external network (not shown), such that the operator of the coating system 10 can access the controller 402 remotely from a separate system or device.

In operation, an operator of the coating system 10 begins a coating operation by placing a substrate 100 on the loading area 20, particularly the second section 312 of the upper conveyer system 300. This can be done manually by the operator, or can be performed by a separate robotic or otherwise automated apparatus (not shown), such as a shuttle conveyer. To commence operation of the coating system 10, the operator actuates a manual button or switch on the body of the coating system 10 or remotely directs the controller 402 to instruct the coating system 10 to being operation, such as through the HMI device 408 of the controller 402. However, when an automated loading mechanism is used, operation of the coating system 10 can commence automatically. Once the coating system 10 begins operation, the second section 312 of the upper conveyer system 300 moves the substrate 100 in a first direction along the lateral direction 4 to the third section 316 of the upper conveyer system 300, and likewise into the housing 104 of the coating station 24. The first direction may be either to the left or the right along the lateral direction 4, depending on the orientation of the coating system 10. Once disposed in the coating station 24, the applicator assembly 106 commences the coating operation, either automatically, upon direction from the operator, or direction from the controller 402. The various aspects of the coating operation (pattern, direction, etc.) can be pre-selected by the operator through the HMI device 408 or recalled from the memory unit 404 of the controller 402. After the coating operation is complete, the substrate 100 is moved by the third section 316 of the upper conveyer system 300 in the first direction into the upper chamber 28a of the first lift 28. Once a sensor 29a disposed within the upper chamber 28a senses that the substrate 100 is completely within the upper chamber 28a, the first lift 28 will convey the substrate 100 downward along the vertical direction 2 to the lower chamber 28b of the first lift 28. Once the sensor 29b disposed within the lower chamber 28b senses that the substrate 100 is completely within the lower chamber 28b, the first lift 28 will convey the substrate 100 to the oven 34, particularly the first oven 34a, in a second direction that is opposite the first direction.

When the substrate 100 enters the first oven 34a, the substrate 100 is disposed on a first section 328 of the lower conveyer system 304, which transports the substrate 100 through the first oven 34a. The first oven 34a, which may be located below the coating station 24, is heated to a first temperature for performing a part of a curing operation on the coating 102 of the substrate 100. The substrate 100 is maintained in the first oven 34a for a first period of time. The first temperature and first period of time can be selected by the operator of the coating system 10 through the HMI device 408, recalled from the memory unit 404 based upon a particular feature of the coating operation, such as substrate type, coating type, etc., or be default values. After the portion of the curing operation to be performed by the first oven 34a is completed, the first section 328 of the lower conveyer system 304 can convey the substrate 100 to a second oven 34b of the oven 34 in the second direction.

When the substrate 100 enters the second oven 34b, the substrate 100 is disposed on a second section 332 of the lower conveyer system 304, which transports the substrate 100 through the second oven 34b. The second oven 34b, which may be located below the loading area 20, is heated to a second temperature for performing a second part of a curing operation on the coating 102 of the substrate 100. The substrate 100 is maintained in the second oven 34b for a second period of time. The second temperature and second period of time can be selected by the operator of the coating system 10 through the HMI device 408, recalled from the memory unit 404 based upon a particular feature of the coating operation, such as substrate type, coating type, etc., or be default values. The second temperature and second period of time may be the same as the first temperature and period of time, respectively, or can be different as desired. After the portion of the curing operation to be performed by the second oven 34b is completed, the second section 332 of the lower conveyer system 304 can convey the substrate 100 to a third oven 34c of the oven 34 in the second direction.

When the substrate 100 enters the third oven 34c, the substrate 100 is disposed on a third section 336 of the lower conveyer system 304, which transports the substrate 100 through the third oven 34c. The third oven 34c, which may be located below the inspection station 54, is heated to a third temperature for performing a third part of a curing operation on the coating 102 of the substrate 100. The substrate 100 is maintained in the third oven 34c for a third period of time. The third temperature and third period of time can be selected by the operator of the coating system 10 through the HMI device 408, recalled from the memory unit 404 based upon a particular feature of the coating operation, such as substrate type, coating type, etc., or be default values. The third temperature and third period of time may be the same as the first and second temperatures and periods of time, respectively, or can be different as desired. After the portion of the curing operation to be performed by the third oven 34c is completed, the third section 336 of the lower conveyer system 304 can convey the substrate 100 to the second lift 50 in the second direction. Though the coating system 10 is described as including an oven 34 that includes three separate ovens 34a-34c, the modular nature of the coating system 10 allows additional ovens to be added or any of the ovens 34a-34c to be taken away. For example, the second oven 34b can be removed from the coating system 10, such that only the first and third ovens 34a and 34c remain, and only the second section 332 of the lower conveyer system 304 is disposed below the loading area 20. Additionally, the first and second ovens 34a and 34b can be removed from the coating system. Alternatively, the first through third ovens 34a-34c can be replaced by a singular oven that comprises the entirety of the oven 34.

After the curing operation is complete, the substrate 100 is moved by the third section 336 of the lower conveyer system 304 in the second direction into the lower chamber 50b of the second lift 50. Once a sensor 51b disposed within the lower chamber 50b senses that the substrate 100 is completely within the lower chamber 50b, the second lift 50 will convey the substrate 100 upward along the vertical direction 2 to the upper chamber 50a of the second lift 50. Once the sensor 51a disposed within the upper chamber 50a senses that the substrate 100 is completely within the upper chamber 50a, the second lift 50 will convey the substrate 100 to the inspection station 54 in the first direction.

Once disposed in the inspection station 54, the applicator assembly 106 commences the inspection operation, either automatically, upon direction from the operator, or direction from the controller 402. The various aspects of the inspection operation (what parts of the substrate 100 and coating 102 are inspected, type of inspection performed, etc.) can be pre-selected by the operator through the HMI device 408 or recalled from the memory unit 404 of the controller 402. Though the inspection operation can be performed by the inspection station 54 itself, inspection can also at least partially include visual inspection by the operator of the coating system 10 when the substrate 100 is in the inspection station 54. If the inspection station 54 detects a feature of the coating 102 of the substrate 100 that does not meet quality standards, the inspection station 54 can send a signal to the controller 402, which can alert the operator of the coating system 10 through the HMI device 408. The alert may be in the form of a sound, light, text notification, etc. After the inspection operation is complete, the substrate 100 is moved by the first section 308 of the upper conveyer system 300 in the first direction to the loading area 20, where the substrate 100 can be removed from the coating system 10. This can be done manually by the operator, or can be performed by a separate robotic or otherwise automated apparatus, such as a shuttle conveyer (not shown). Optionally, one operator can be situated on one side of the loading area 20 for placing a substrate 100 on the loading area 20, while another operator is situated on the opposite side of the loading area 20 for removing the substrate 100 from the loading area 20.

While the invention is described herein using a limited number of embodiments, these specific embodiments are not intended to limit the scope of the invention as otherwise described and claimed herein. The precise arrangement of various elements and order of the steps of articles and methods described herein are not to be considered limiting. For instance, although the steps of the methods are described with reference to sequential series of reference signs and progression of the blocks in the figures, the method can be implemented in a particular order as desired.

What is claimed is:

1. A system for applying a coating to a substrate, the system comprising:
   a coating station for applying a coating material to the substrate, wherein the coating station has a bottom portion;
   an oven for curing the coating material on the substrate, wherein the oven is positioned vertically below the bottom portion, such that a vertical axis extends vertically through both the oven and the bottom portion, wherein the oven comprises a first opening configured to receive the substrate, the oven comprises a second opening that is offset from the first opening, and the first opening and the second opening are configured such that the substrate is transportable through the first opening and the second opening, wherein the first opening and the second opening of the oven are opposed to one another, whereby the first opening is configured to receive the substrate moving in a first direction and the second opening is configured such that the substrate moves in the first direction to exit the second opening; and
   a first lift for transporting the substrate from the coating station to the oven, whereby the first lift is configured to transport the substrate downward along a second direction that is parallel to the vertical axis to the oven.

2. The system of claim 1, further comprising an inspection station for inspecting the substrate.

3. The system of claim 2, further comprising a loading area disposed between the inspection station and the coating station, wherein the loading area includes a conveyer that extends from the inspection station to the coating station.

4. The system of claim 3, wherein the oven is a first oven, and the system further comprises a second oven positioned vertically below the conveyer, such that the second oven is also positioned vertically below the bottom portion of the coating station.

5. The system of claim 4, wherein the second oven is adjacent to the first oven.

6. The system of claim 4, wherein the second oven operates at a different temperature than the first oven.

7. The system of claim 2, wherein the inspection station includes a camera for capturing images of the substrate.

8. The system of claim 1, wherein the coating station includes a jetting dispenser for applying the coating material to the substrate.

9. The system of claim 1, further comprising a vacuum chamber for removing bubbles from the coating material.

10. The system of claim 1, further comprising a plasma system for treating the substrate.

11. The system of claim 1, wherein the oven is positioned entirely and immediately vertically below the bottom portion.

12. The system of claim 1, wherein the first opening and the second opening of the oven are diametrically opposed to one another.

13. The system of claim 12, further comprising and an endless lower conveyor system that is configured to transport the substrate from the first opening to the second opening.

14. The system of claim 13, further comprising and an endless upper conveyor system that is configured to transport the substrate through the coating station.

15. A system for applying a coating to a substrate, the system comprising:
    a coating station for applying a coating material to the substrate, wherein the coating station has a bottom portion;
    a first oven for curing the coating material on the substrate, wherein the first oven is positioned vertically below the bottom portion, such that a vertical axis extends vertically through both the first oven and the bottom portion;
    a first lift for transporting the substrate from the coating station to the first oven, whereby the first lift is configured to transport the substrate downward along the vertical axis to the first oven;
    an inspection station for inspecting the substrate;
    a loading area disposed between the inspection station and the coating station, wherein the loading area includes a conveyer that extends from the inspection station to the coating station;
    a second oven positioned vertically below the conveyer, such that the second oven is also positioned vertically below the bottom portion of the coating station; and
    a third oven positioned vertically below the inspection station, such that the third oven is also positioned below the bottom portion.

16. The system of claim 15, wherein the third oven is spaced from the first oven.

17. The system of claim 15, wherein the third oven operates at a different temperature than the first oven.

18. The system of claim 15, further comprising a second lift for transporting the substrate from the third oven to the inspection station.

19. A method for applying a coating to a substrate, the method comprising:
    applying a coating material to the substrate with a coating station;

transporting the substrate from the coating station to an oven in a vertically downward direction, wherein the oven receives the substrate at a first opening of the oven and the substrate moves through the first opening;

curing the coating on the substrate within the oven;

after curing the coating, transporting the substrate through a second opening, that is offset from the first opening, of the oven and transporting the substrate from the second opening of the oven in a vertically upward direction opposite the vertically downward direction to an inspection station, wherein the first opening and the second opening of the oven are opposed to one another, whereby the first opening receives the substrate moving in a first direction and the substrate moves in the first direction to exit the second opening; and inspecting the substrate with the inspection station.

20. The method of claim 19, wherein applying the coating includes moving the substrate along the first direction through the coating station.

21. The method of claim 20, wherein inspecting the coating includes moving the substrate through the inspection station along the first direction.

22. The method of claim 20, wherein curing the coating includes moving the substrate through the oven along a second direction that is opposite the first direction, whereby the substrate enters the first opening of the oven and exits the second opening of the oven.

23. The method of claim 22, wherein the oven includes a first oven and a second oven that is adjacent to the first oven.

24. The method of claim 23, wherein the oven further includes a third oven that is adjacent to the second oven.

* * * * *